US012283502B2

(12) United States Patent
Kim et al.

(10) Patent No.: US 12,283,502 B2
(45) Date of Patent: Apr. 22, 2025

(54) SUBSTRATE TRANSFER DEVICE AND SUBSTRATE TRANSFER METHOD

(71) Applicant: Samsung Electronics Co., Ltd., Suwon-si (KR)

(72) Inventors: Young Wook Kim, Seoul (KR); Sang Min Kim, Hwaseong-si (KR); Ji Hun Kim, Uiwang-si (KR); Gi-Nam Park, Incheon (KR); Chul-Jun Park, Seoul (KR); Yong-Jun Ahn, Suwon-si (KR); Youn Gon Oh, Hwaseong-si (KR); Byung Kook Yoo, Hwaseong-si (KR); Hyun Woo Lee, Hwaseong-si (KR); Jeong Hun Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 687 days.

(21) Appl. No.: 17/543,025

(22) Filed: Dec. 6, 2021

(65) Prior Publication Data
US 2022/0336241 A1 Oct. 20, 2022

(30) Foreign Application Priority Data

Apr. 19, 2021 (KR) ........................ 10-2021-0050233

(51) Int. Cl.
*G06F 7/00* (2006.01)
*H01L 21/67* (2006.01)
*H01L 21/677* (2006.01)

(52) U.S. Cl.
CPC .. *H01L 21/67265* (2013.01); *H01L 21/67742* (2013.01); *H01L 21/67745* (2013.01)

(58) Field of Classification Search
CPC ......... H01L 21/67265; H01L 21/67742; H01L 21/67745; H01L 21/6773; H01L 21/67736; H01L 21/67769; H01L 21/67733; H01L 21/67706; B65G 1/0457; B65G 2201/0297; G05B 19/4189
USPC ................................................... 700/213, 230
See application file for complete search history.

(56) References Cited

U.S. PATENT DOCUMENTS

| 7,527,141 B2 | 5/2009 | Rice et al. |
| 8,043,039 B2 | 10/2011 | Yamamoto et al. |
| 10,684,613 B2 | 6/2020 | Oh |

FOREIGN PATENT DOCUMENTS

| JP | 2003051528 A | 2/2003 | |
| JP | 2004299895 A | 10/2004 | |
| JP | 2010152766 A | 7/2010 | |
| JP | 2019140217 A | 8/2019 | |
| KR | 2002064918 A | * 8/2002 | ......... G03F 7/70525 |

* cited by examiner

*Primary Examiner* — Yolanda R Cumbess
(74) *Attorney, Agent, or Firm* — MORGAN, LEWIS & BOCKIUS LLP

(57) ABSTRACT

A substrate transfer device includes a transfer unit configured to transfer, in a first direction, a carrier in which substrates are stored, an upper interface unit configured to move the transfer unit, a lower interface unit configured to receive the carrier from the transfer unit, and a controller configured to control the upper interface unit and the lower interface unit integrally such that the transfer unit and the carrier move in the first direction at the same time.

20 Claims, 9 Drawing Sheets

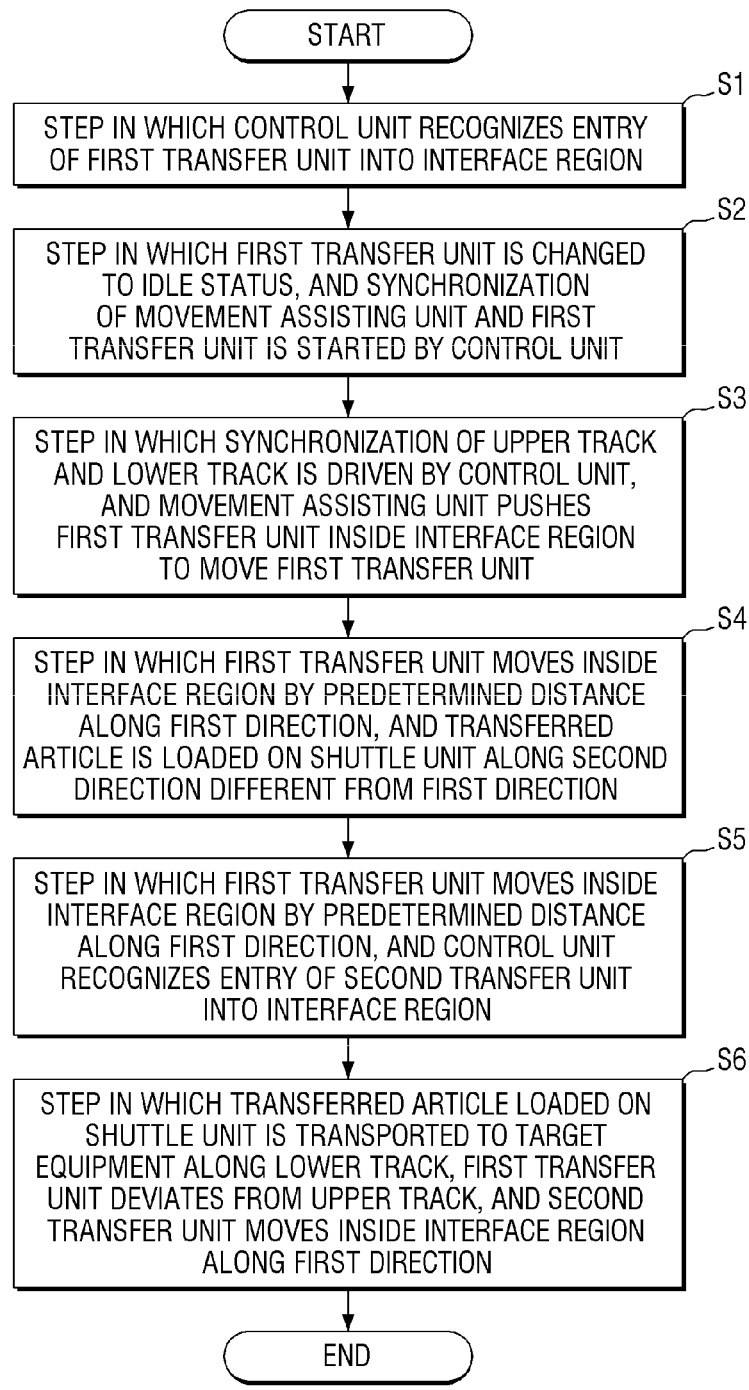

SUBSTRATE TRANSFER DEVICE AND SUBSTRATE TRANSFER METHOD

CROSS-REFERENCE TO RELATED APPLICATION

This application claims priority from Korean Patent Application No. 10-2021-0050233 filed on Apr. 19, 2021 in the Korean Intellectual Property Office, the contents of which are herein incorporated by reference in their entirety.

BACKGROUND

The present disclosure relates to a substrate transfer device and a substrate transfer method.

In general, a semiconductor or a display device may be manufactured by repeatedly performing a series of manufacturing processes on a substrate such as a silicon wafer or a glass substrate. For example, manufacturing processes such as deposition, photoetching, oxidation, ion implantation, and cleaning may be performed selectively and/or repeatedly to form circuit patterns on the substrate.

Such manufacturing processes may be performed in a clean room in which a pollution control is performed. A substrate transfer between such manufacturing processes is performed by providing a substrate to process equipment for processing the process or retrieving the substrate from the process equipment, using a carrier which stores multiple substrates, for example, a front opening unified pod (FOUP), a shipping box (FOSB), and the like. Such a carrier may be generally transferred by an overhead hoist transport (OHT). The overhead hoist transport transfers the carrier which stores the substrates before the process processing, loads the carrier on an empty storage structure, picks up the carrier which stores the substrates subjected to the process processing from the storage structure, and transports the carrier to the outside.

In the procedure for transporting a transferred article such as a carrier which stores the substrate by a ceiling traveling transfer device, there is a need to increase the efficiency of an operation in which a large number of transfer units transfer the transferred article.

SUMMARY

Aspects of the present disclosure are to smoothly perform the transportation of an article, even without stopping a transfer unit (e.g., of a ceiling traveling transfer device).

Aspects of the present disclosure are also to efficiently perform the transportation of an article by controlling loading and unloading processes of a plurality of transfer units (e.g., of a ceiling traveling transfer device) through a single control unit.

According to an embodiment of the present disclosure, there is provided a substrate transfer device including a transfer unit configured to transfer, in a first direction, a carrier in which substrates are stored, an upper interface unit configured to move the transfer unit, a lower interface unit configured to receive the carrier from the transfer unit, and a controller configured to control the upper interface unit and the lower interface unit integrally such that the transfer unit and the carrier move in the first direction at the same time.

According to the aforementioned and other embodiments of the present disclosure, there is provided an article transfer device including a transfer unit that transfers an article in a first direction, and an interface unit including a movement assisting unit configured to move the transfer unit and a shuttle unit configured to transport the transferred article from the transfer unit, wherein the movement assisting unit and the shuttle unit are controlled by a single control unit to be disposed at the same position in the first direction.

According to the aforementioned and other embodiments of the present disclosure, there is provided a substrate transfer method including providing a substrate transfer device including a first transfer unit configured to transfer a carrier in which substrates are stored in a first direction, an upper interface unit including an upper track configured to move the first transfer unit in the first direction and a movement assisting mechanism configured to assist movement of the first transfer unit, a lower interface unit including a lower track disposed below the upper track and a shuttle on the lower track and configured to transport the carrier from the first transfer unit to target equipment, and a controller that integrally controls the upper interface unit and the lower interface unit, controlling, by the controller, the movement assisting mechanism and the shuttle to be at the same position in the first direction in a region in which the upper interface unit and the lower interface unit overlap, and moving the first transfer unit in the first direction in an interface region corresponding to the overlapped region, and at the same time, loading the carrier on the shuttle along a second direction perpendicular to the first direction.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof referring to the attached drawings, in which:

FIG. 9 is a flowchart for explaining the substrate transfer method according to some embodiments.

DETAILED DESCRIPTION

Figure 1:
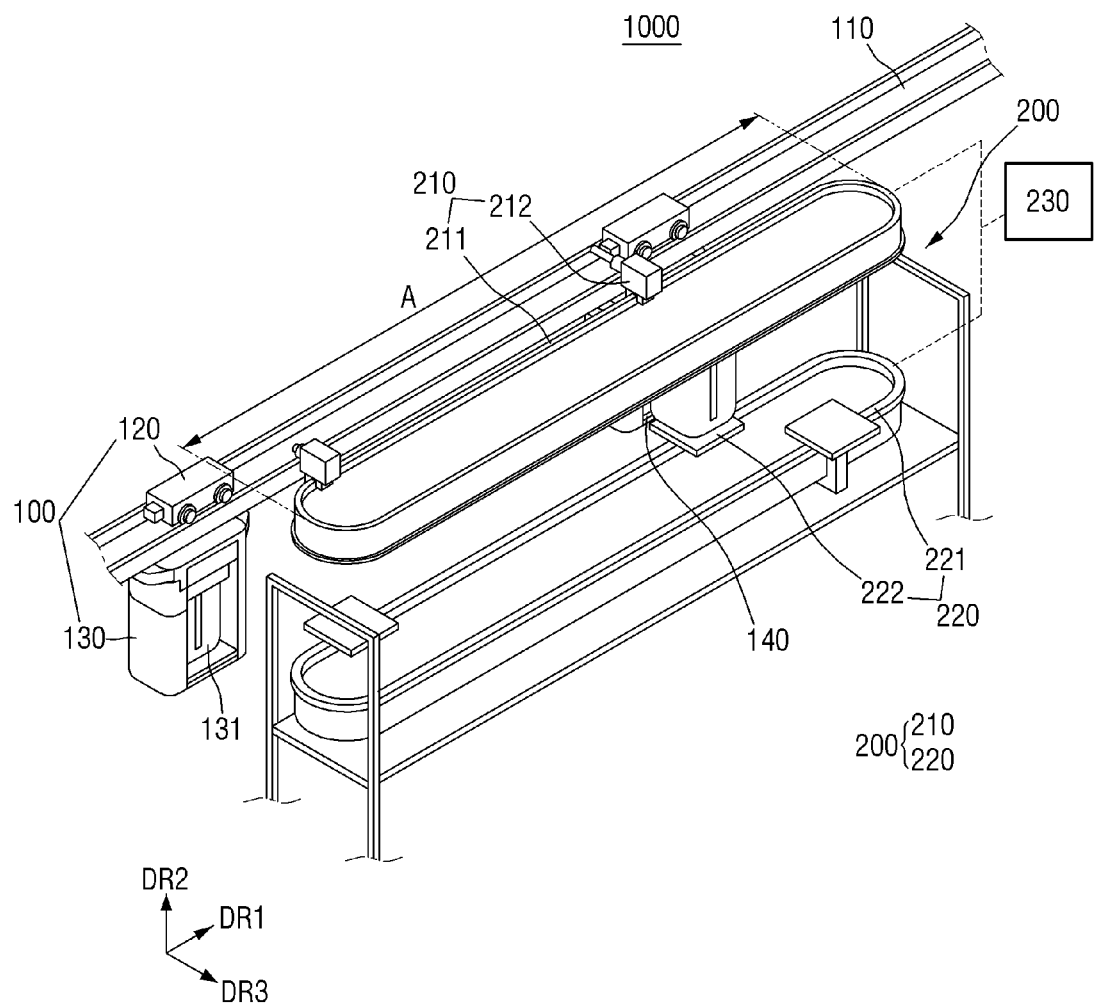
FIG. 1 is an example diagram for explaining a substrate transfer device according to some embodiments.
Figure 2:
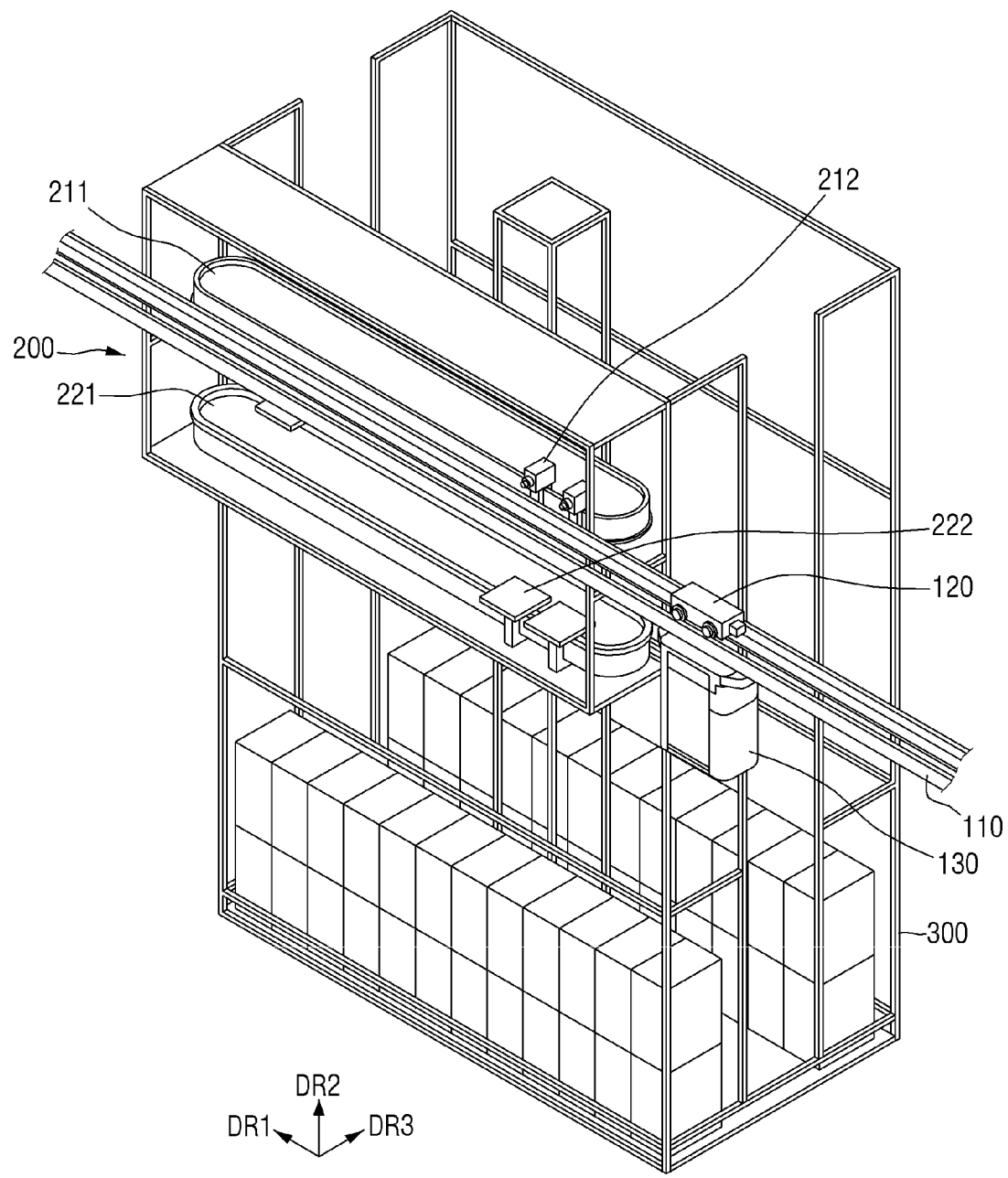
FIG. 2 is a diagram schematically showing a positional relationship between the substrate transfer device of FIG. 1 and a target equipment.

FIG. 1 is an example diagram for explaining a substrate transfer device according to some embodiments. FIG. 2 is a diagram schematically showing a positional relationship between the substrate transfer device of FIG. 1 and a target equipment.

Referring to FIGS. 1 and 2, a substrate transfer device 1000 according to some embodiments may include a transfer unit or transfer system 100 and an interface unit or interface system 200.

The transfer unit 100 includes a traveling unit 120 that travels on a rail 110 to transfer a carrier 131 in which a substrate is stored in a first direction DR1, a hoist or hoist unit 130, and a slider 140.

The hoist unit 130 is placed below the rail 110 and is transferred by operating the transfer unit 100. The hoist unit 130 may transfer the carrier 131 in which the substrate is stored between various process equipment in which a semiconductor process is performed.

The slider 140 moves from the transfer unit 100 in a third direction DR3 so that a carrier 131 may be loaded on a shuttle or shuttle unit 222 along the third direction DR3 that may be perpendicular to the first direction DR1.

The interface unit 200 includes an upper interface unit or upper interface system 210 which moves the transfer unit 100, and a lower interface unit or lower interface system 220 which transports the carrier 131 storing the substrate from the transfer unit 100.

The upper interface unit 210 includes an upper track 211 on which the transfer unit 100 moves in the first direction DR1, and a movement assisting unit or movement assisting mechanism 212 that assists the movement of the transfer unit 100.

In some embodiments, the upper track 211 and the movement assisting unit 212 may include a magnetic material. As an example, the movement assisting unit 212 may move in the first direction DR1 along the upper track 211 by an interaction between the upper track 211 and the magnetic material included in the movement assisting unit 212.

The lower interface unit 220 includes a lower track 221 which is disposed below the upper track 211 and on which the carrier 131 in which the substrate is stored moves, and a shuttle unit 222 which transports the carrier 131 from the transfer unit 100 to target equipment 300. In some embodiments, the upper track 211 and the lower track 221 are vertically aligned.

The upper interface unit 210 and the lower interface unit 220 form or define regions that overlap or are aligned with each other, on the basis of a second direction DR2 perpendicular to the first direction DR1. In some embodiments, an interface region A (see also FIG. 3) is one region on the rail 110, and means a region that corresponds to the region in which the upper interface unit 210 and the lower interface unit 220 overlap or are aligned.

A control unit or controller 230 controls the movement assisting unit 212 and the transfer unit 100 to be synchronized with each other. In some embodiments, the synchronization may mean an operation that integrally controls the upper interface unit 210 and the lower interface unit 220 to cause the transfer unit 100 and the carrier 131 to move integrally in the first direction DR1. Further, as will be described below, the synchronization may mean an operation that causes the transfer unit 100 to move in the first direction DR1 and the carrier 131 to be transported in the third direction DR3.

In order to perform the aforementioned synchronization, the control unit 230 may include a sensor unit or sensor that recognizes an entry of the transfer unit 100 into the interface region A.

The control unit 230 controls the upper track 211 and the lower track 221 to be synchronized with each other. The movement assisting unit 212 pushes the transfer unit 100 so that the transfer unit 100 moves in the interface region A.

The control unit 230 controls the movement assisting unit 212 and the shuttle unit 222 to be disposed to correspond to each other in the first direction DR1. That is, the control unit 230 controls the movement assisting unit 212 and the shuttle unit 222 to be disposed at the same position in the first direction DR1. Further, the control unit 230 may control the movement assisting unit 212 and the shuttle unit 222 to move in the first direction DR1 at the same speed.

In the interface region A, the transfer unit 100 moves in the first direction DR1, and at the same time, the carrier 131 is loaded on the shuttle unit 222 along the third direction DR3 different from the first direction DR1.

FIGS. 3 to 8 are intermediate stage diagrams for explaining a substrate transfer method using the substrate transfer device according to some embodiments. FIG. 9 is a flowchart for explaining the substrate transfer method according to some embodiments.

Figure 3:
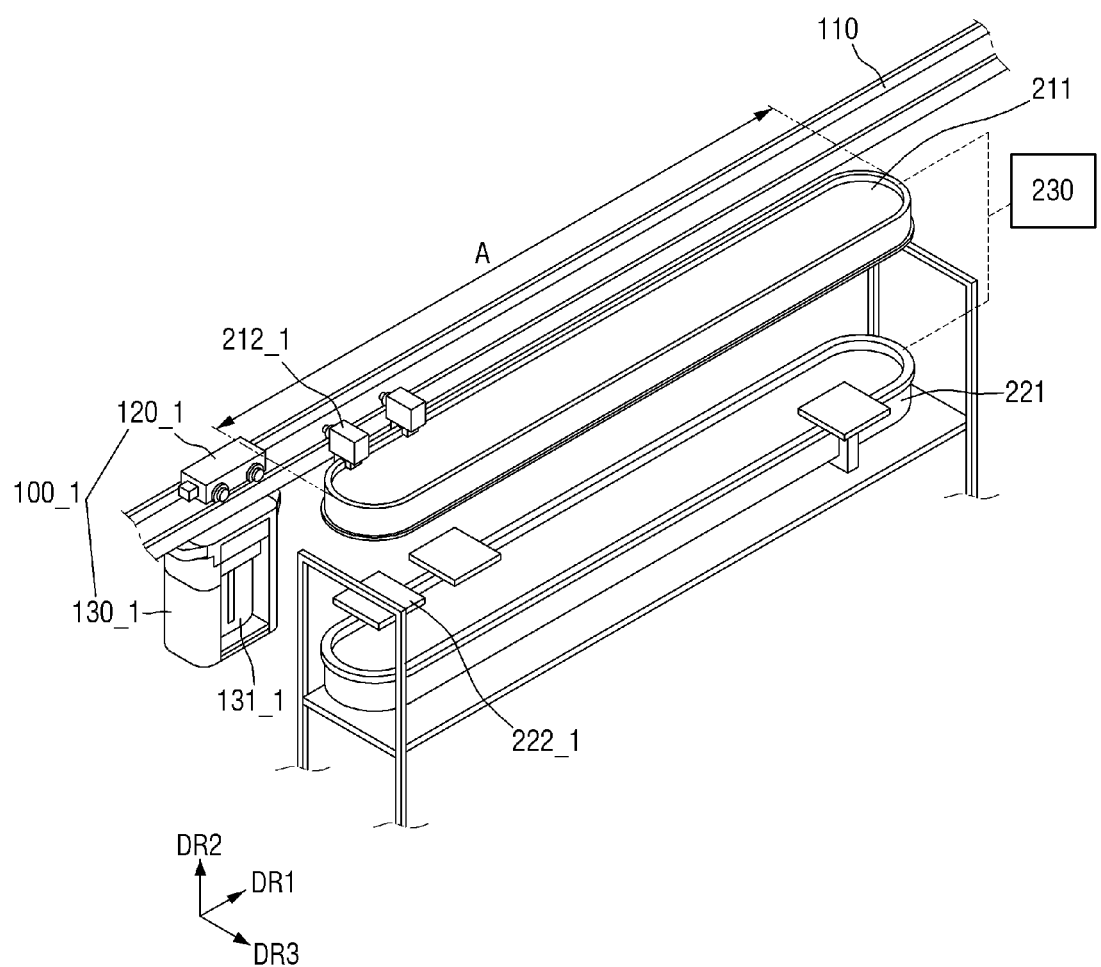
FIGS. 3 to 8 are intermediate stage diagrams for explaining a substrate transfer method using the substrate transfer device according to some embodiments.

Referring to FIG. 3, the control unit 230 recognizes that a first transfer unit 100_1 enters the interface region A (S1). The first transfer unit 100_1 includes a first traveling unit 120_1 that travels on the rail 110 to transfer the first carrier 131_1 in which substrates are stored in the first direction DR1, a first hoist unit 130_1, and a first slider 140_1 (see also FIG. 6).

A communication means or communication system disposed inside the first transfer unit 100_1 may transmit a signal by which the first transfer unit 100_1 approaches the interface region A to the control unit 230. The control unit 230 may receive a signal by which the first transfer unit 100_1 approaches the interface region A from the first transfer unit 100_1. The control unit 230 may receive the signal transmitted by the first transfer unit 100_1 to recognize that the first transfer unit 100_1 enters the interface region A by the sensor unit.

In some embodiments, traveling of the first transfer unit 100_1 along the rail 110 in a region other than the interface region A may be controlled by another control unit or another controller.

Figure 4:
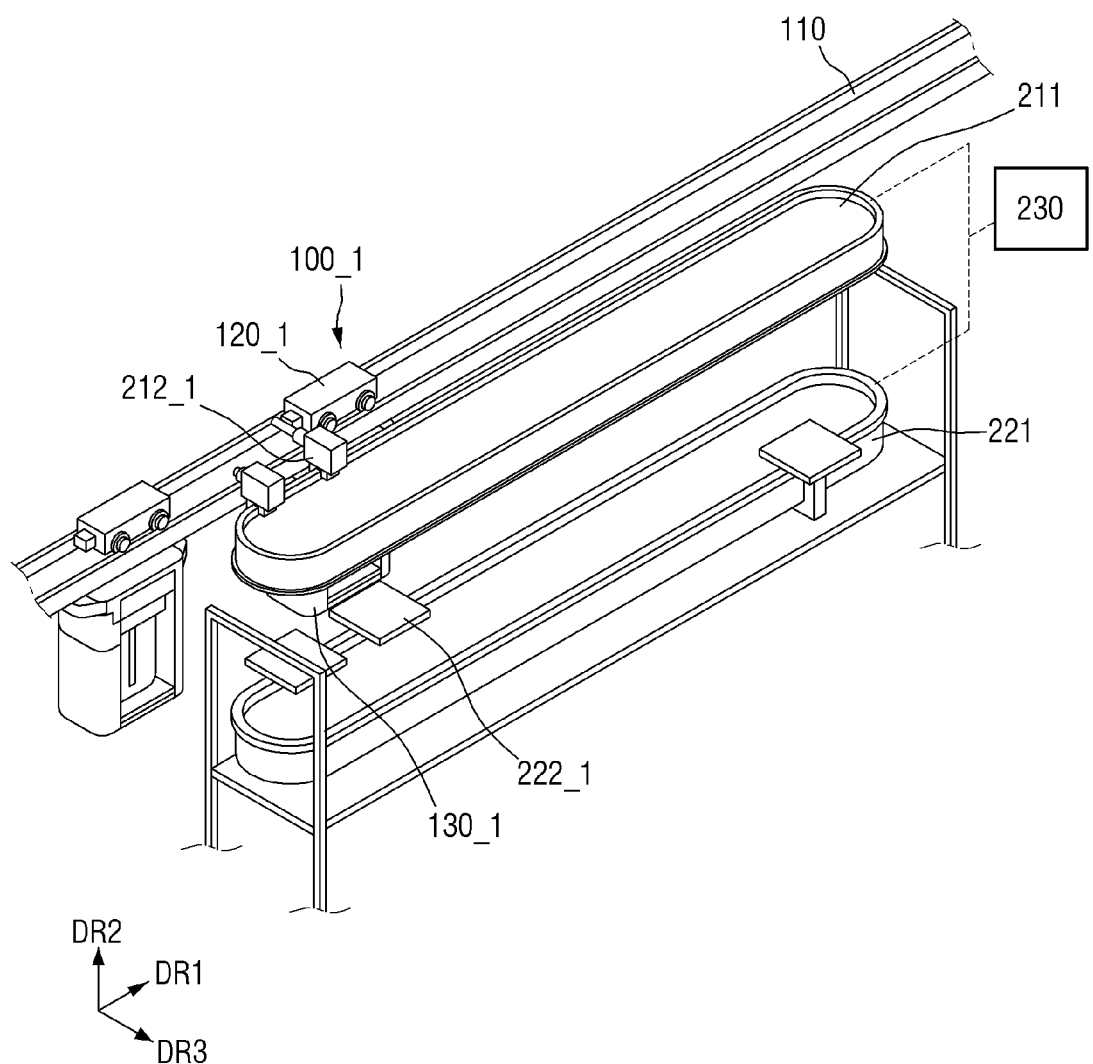

On the other hand, the first transfer unit 100_1 that has entered the interface region A may be changed to an idle status or state. Referring to FIG. 4, when the first transfer unit 100_1 stops at a certain point on the rail 110, the first movement assisting unit 212_1 may be driven. That is, the first movement assisting unit 212_1 may be driven along the first direction DR1 or the third direction DR3 to push the first transfer unit 100_1 which is in the idle status. Subsequently, synchronization of the first movement assisting unit 212_1 and the first transfer unit 100_1 is started by the control unit 230 (S2).

Figure 5:
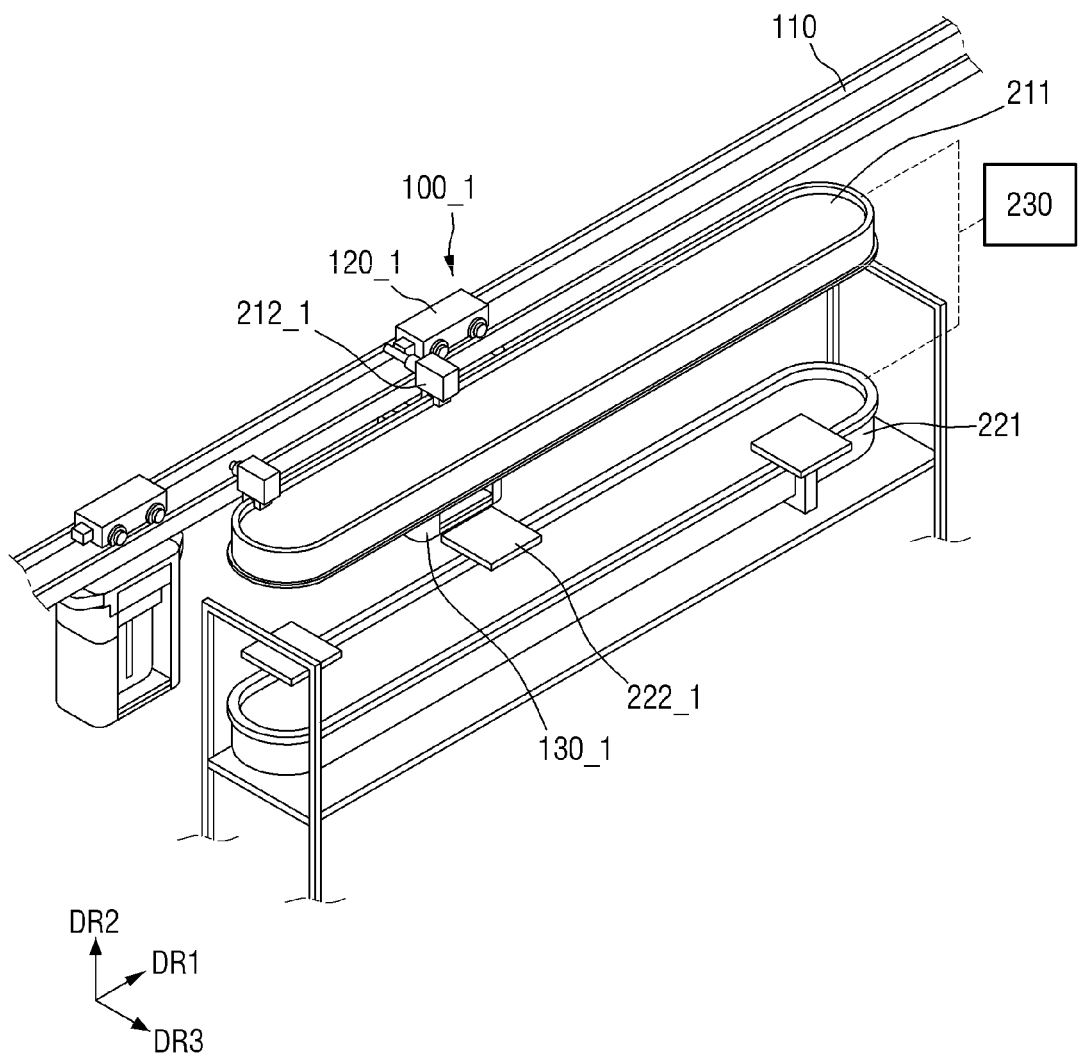

Referring to FIG. 5, the control unit 230 drives the synchronization of the upper track 211 and the lower track 221, and the first movement assisting unit 212_1 pushes the first transfer unit 100_1 in the interface region A to move the first transfer unit 100_1 (S3).

That is, the control unit 230 controls the first movement assisting unit 212_1 and the first shuttle unit 222_1 to be disposed at the same position in the first direction DR1. Further, the control unit 230 may control the first movement assisting unit 212_1 and the first shuttle unit 222_1 to move in the first direction DR1 at the same speed.

Figure 6:
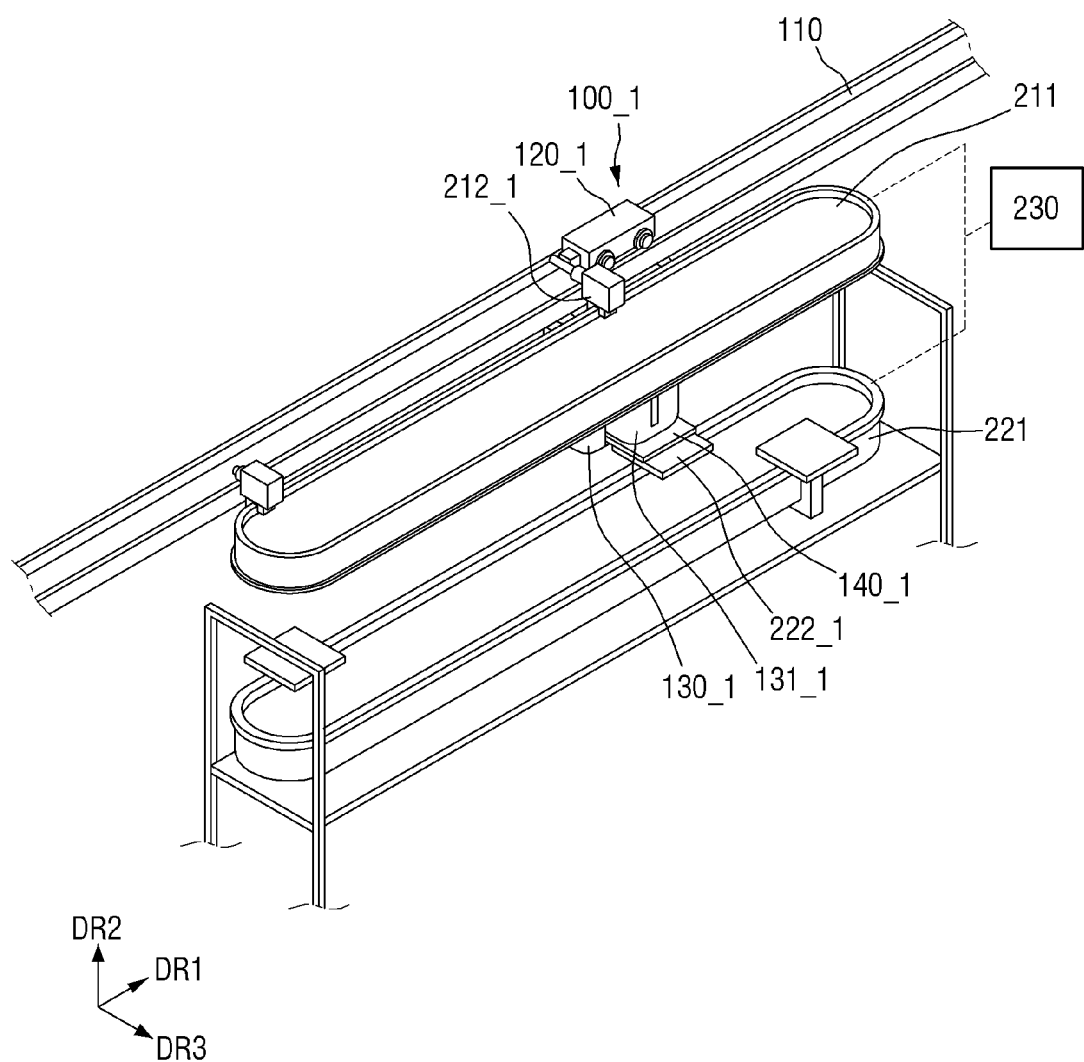

Referring to FIG. 6, as compared to FIG. 4, the first transfer unit 100_1 moves inside the interface region A by a predetermined distance along the first direction DR1, and the first carrier 131_1 is loaded on the first shuttle unit 222_1 along the third direction DR3 (S4). The loading of the first carrier 131_1 on the first shuttle unit 222_1 along the third direction DR3 may be performed through the first slider 140_1. That is, the first slider 140_1 moves from the first transfer unit 100_1 in the third directions DR3 so that the first carrier 131_1 may be loaded on the first shuttle unit 222_1 along the third direction DR3.

As a result, the operation in which the transfer unit 100 travels on the rail 110 and the operation of loading the carrier 131 on the shuttle unit 222 may be performed at the same time. Accordingly, the operation of transporting the transferred article to the target equipment 300 or the like by the transfer unit 100 may be performed, even without stopping the transfer unit 100 which is traveling on the rail 110.

Figure 7:
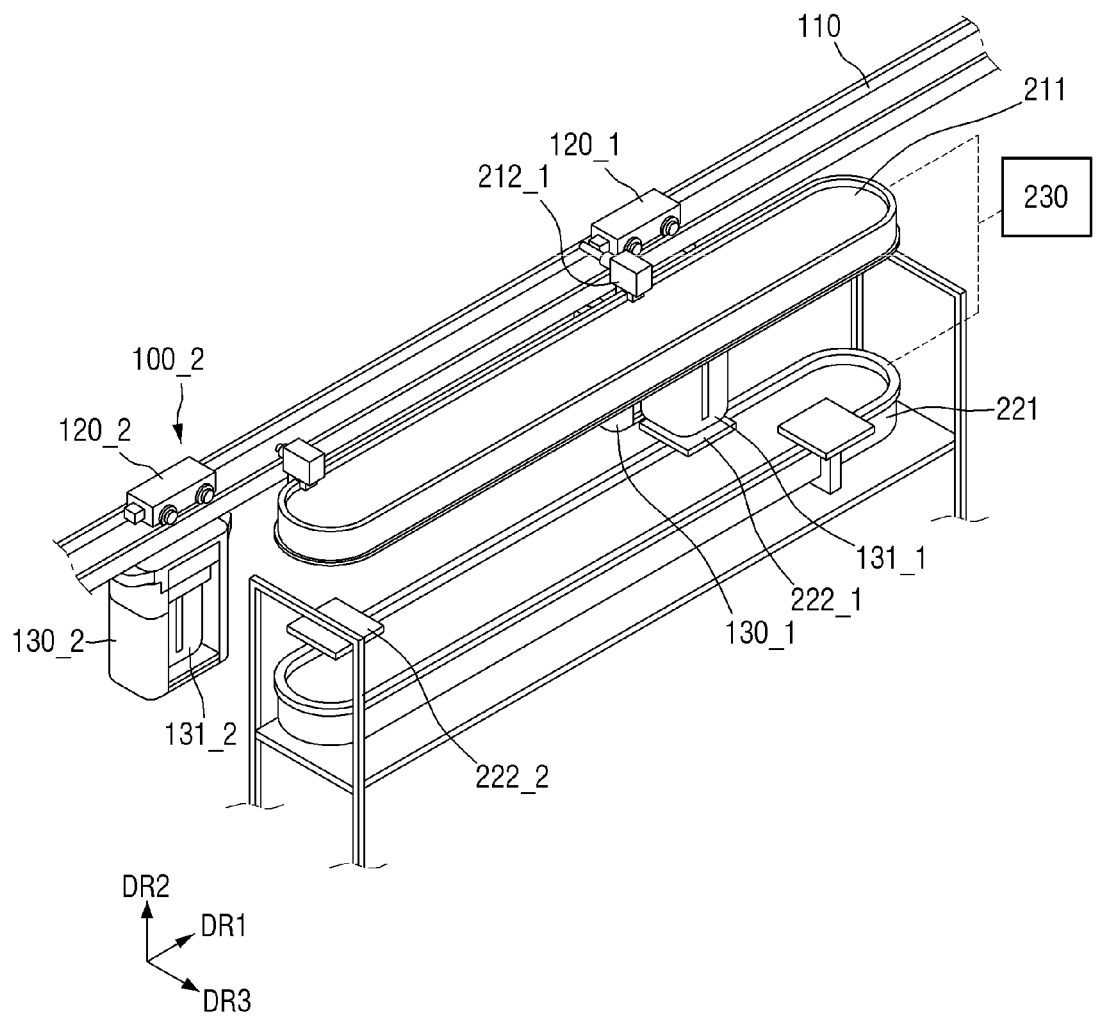

Referring to FIG. 7, as compared with FIG. 4, the first transfer unit 100_1, which is a preceding transfer unit, moves inside the interface region A by a predetermined distance along the first direction DR1, and then a second transfer unit 100_2, which is a succeeding transfer unit, may enter the interface region A. In this case, the control unit 230 may recognize that the second transfer unit 100_2 enters the interface region A (S5).

Figure 8:
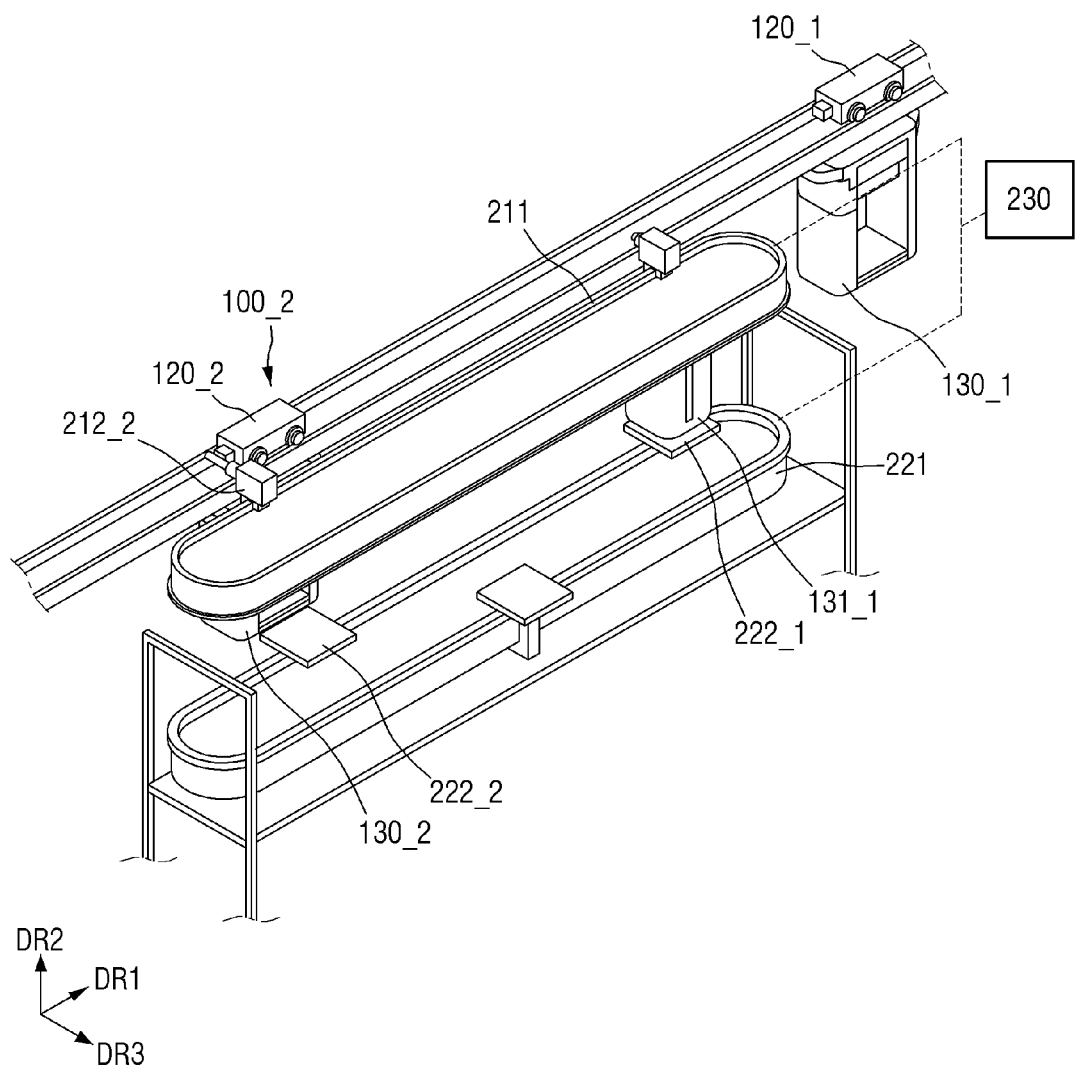

Referring to FIG. 8, the first carrier 131_1 loaded on the first shuttle unit 222_1 is transported to the target equipment 300 along the lower track 221, and the first transfer unit 100_1 may deviate from the upper track 211 or exit the interface region A.

That is, when the operation of loading the first carrier 131_1 on the first shuttle unit 222_1 is completed, the synchronization of the first movement assisting unit 212_1 and the first shuttle unit 222_1 may be released or stopped. In this case, the control unit 230 performs a control so that synchronization of the first movement assisting unit 212_1 and the first shuttle unit 222_1 is released.

When synchronization of the first movement assisting unit 212_1 and the first shuttle unit 222_1 is released, the status of the first transfer unit 100_1 is changed to be controlled by the control unit. The first transfer unit 100_1 is driven by the control unit and may deviate from the upper track 211.

The second transfer unit 100_2 moves inside the interface region A along the first direction DR1 (S6). In some embodiments, a traveling mechanism and a loading mechanism of the second transfer unit 100_2 may be similar to a traveling mechanism and a loading mechanism of the first transfer unit 100_1.

Specifically, the control unit 230 recognizes that the second transfer unit 100_2 enters the interface region A, and controls the upper track 211 and the lower track 221 to be synchronized with each other. As a result, a second movement assisting unit 212_2 pushes the second transfer unit 100_2 so that the second transfer unit 100_2 moves in the interface region A. After that, the control unit 230 controls the second movement assisting unit 212_2 and the second shuttle unit 222_2 to be disposed at the same position in the first direction DR1 and/or to move at the same speed. Accordingly, the second transfer unit 100_2 moves in the interface region A in the first direction DR1, and at the same time, the second carrier 131_2 is loaded on the second shuttle unit 222_2 along a third direction DR3 different from the first direction DR1.

According to the series of operations described above, the operation in which the transfer unit 100 travels on the rail 110 and the operation of loading the carrier 131 on the shuttle unit 222 may be performed at the same time. Accordingly, the operation of transporting the transferred article to the target equipment or the like by the preceding transfer unit may be performed, even without stopping the succeeding transfer unit. Furthermore, since the loading mechanism of the preceding transfer unit and the succeeding transfer unit may be performed independently, a large amount of transferred articles may be transported more efficiently.

In concluding the detailed description, those skilled in the art will appreciate that many variations and modifications may be made to the example embodiments without substantially departing from the principles of the present disclosure. Therefore, the disclosed example embodiments of the invention are used in a generic and descriptive sense only and not for purposes of limitation.

What is claimed is:

1. A substrate transfer device comprising:
   a transfer unit configured to transfer, in a first direction, a carrier in which substrates are stored;
   an upper interface unit configured to move the transfer unit, and a lower interface unit configured to receive the carrier from the transfer unit; and
   a controller configured to control the upper interface unit and the lower interface unit integrally such that the transfer unit and the carrier move in the first direction at the same time.

2. The substrate transfer device of claim 1, wherein the upper interface unit includes an upper track on which the transfer unit moves in the first direction, and a movement assisting mechanism which assists the movement of the transfer unit, and
   the lower interface unit includes; a lower track disposed below the upper track on which the carrier moves and a shuttle which transports the carrier from the transfer unit to target equipment.

3. The substrate transfer device of claim 2, wherein the controller is configured to synchronize the upper track and the lower track with each other.

4. The substrate transfer device of claim 2,
   wherein the upper interface unit and the lower interface unit define regions which overlap each other in a second direction that is perpendicular to the first direction, and a rail on which the transfer unit travels has an interface region corresponding to the regions which overlap each other.

5. The substrate transfer device of claim 4, wherein the controller includes or interacts with a sensor unit which is configured to recognize an entry of the transfer unit into the interface region.

6. The substrate transfer device of claim 4, wherein the movement assisting mechanism is configured to push the transfer unit so that the transfer unit moves in the interface region.

7. The substrate transfer device of claim 4, wherein the controller is configured to control the movement assisting mechanism and the transfer unit to be synchronized with each other.

8. The substrate transfer device of claim 4, wherein the transfer unit is configured to move in the first direction in the interface region while the carrier is loaded on the shuttle along a third direction different from the first direction.

9. The substrate transfer device of claim 6, wherein the controller is configured to control the movement assisting mechanism and the shuttle to be positioned to correspond to each other in the first direction.

10. The substrate transfer device of claim 6, wherein the controller is configured to control the movement assisting mechanism and the shuttle to move in the first direction at the same speed.

11. An article transfer device comprising:
    a transfer unit that transfers an article in a first direction; and
    an interface unit including a movement assisting unit configured to move the transfer unit and a shuttle unit configured to receive the article from the transfer unit and to transport the transferred article from the transfer unit,
    wherein the movement assisting unit and the shuttle unit are both controlled by a control unit, so that the movement assisting unit and the shuttle unit are moved in the first direction to be disposed at the same position in the first direction.

12. The article transfer device of claim 11, wherein the control unit controls the movement assisting unit and the transfer unit to be synchronized with each other.

13. The article transfer device of claim 11, wherein the interface unit further includes an upper track and a lower track that have regions that are vertically aligned with each other, and
a rail on which the transfer unit travels has an interface region corresponding to the aligned regions.

14. The article transfer device of claim 13, wherein the control unit controls the upper track and the lower track to be synchronized with each other.

15. The article transfer device of claim 13, wherein the transfer unit moves in the first direction in the interface region, and at the same time, the transferred article is loaded on the shuttle unit along a third direction different from the first direction.

16. A substrate transfer method, comprising:
providing a substrate transfer device comprising:
a first transfer unit configured to transfer a carrier in which substrates are stored,
an upper interface unit including an upper track configured to move the first transfer unit in a first direction and a movement assisting mechanism configured to assist movement of the first transfer unit,
a lower interface unit including a lower track disposed below the upper track and a shuttle disposed on the lower track, the shuttle being configured to transport the carrier from the first transfer unit to target equipment, and
a controller that integrally controls the upper interface unit and the lower interface unit;
controlling, by the controller, the movement assisting mechanism and the shuttle to be at the same position in the first direction in a region in which the upper interface unit and the lower interface unit overlap; and
moving the first transfer unit in the first direction in an interface region corresponding to the overlapped region, and at the same time, loading the carrier on the shuttle along a second direction perpendicular to the first direction.

17. The substrate transfer method of claim 16, w further comprising:
recognizing the controller, an entry of the first transfer unit into the interface region, and
synchronizing, by the controller, the first transfer unit in an idle state and the movement assisting mechanism.

18. The substrate transfer method of claim 17, further comprising:
synchronizing, by the controller, the upper track and the lower track, and
assisting, by the movement assisting mechanism, the movement of the first transfer unit by pushing the first transfer unit in the interface region.

19. The substrate transfer method of claim 18, further comprising:
moving the first transfer unit moves inside the interface region by a predetermined distance along the first direction and loading the carrier onto the shuttle along the second direction.

20. The substrate transfer method of claim 19, further comprising:
recognizing, by the controller, an entry of a second transfer unit into the interface region,
transporting the carrier loaded on the shuttle to target equipment along the lower track, wherein the first transfer unit exits the interface region upon the carrier being loaded onto the shuttle, and
moving the second transfer unit moves inside the interface region along the first direction.

* * * * *